US006196852B1

(12) United States Patent
Neumann et al.

(10) Patent No.: US 6,196,852 B1
(45) Date of Patent: Mar. 6, 2001

(54) CONTACT ARRANGEMENT

(75) Inventors: Gerd Neumann; Hans-Jürgen Thoene, both of Paderborn (DE)

(73) Assignee: Siemens Nixdorf Informationssysteme Aktiengesellschaft, Paderborn (DE)

( * ) Notice: Subject to any disclaimer, the term of this patent is extended or adjusted under 35 U.S.C. 154(b) by 0 days.

(21) Appl. No.: 09/402,417

(22) PCT Filed: Mar. 3, 1998

(86) PCT No.: PCT/DE98/00634

§ 371 Date: Oct. 4, 1999

§ 102(e) Date: Oct. 4, 1999

(87) PCT Pub. No.: WO98/44599

PCT Pub. Date: Oct. 8, 1998

(30) Foreign Application Priority Data

Apr. 2, 1997 (DE) ............................................. 197 13 661

(51) Int. Cl.[7] ..................................................... H05K 1/00

(52) U.S. Cl. ................................................ 439/66; 439/81

(58) Field of Search ............................... 439/66, 71, 591, 439/91, 69, 74, 81, 82, 65, 885; 29/832, 837, 838, 839, 840

(56) References Cited

U.S. PATENT DOCUMENTS 4,906,198 * 3/1990 Cosimano et al. ..................... 439/82
5,007,843 4/1991 Smolley .
5,152,695 10/1992 Grabbe et al. .
5,169,320 12/1992 Burkett, Jr. et al. .
5,173,055 * 12/1992 Grabbe .................................. 439/66
5,184,962 2/1993 Noschese .
5,462,440 10/1995 Rothenberger .
5,683,274 * 11/1997 Staeb et al. .......................... 439/839
5,812,378 * 9/1998 Fjelstad et al. ...................... 361/769
5,934,914 * 8/1999 Fjelstad et al. ........................ 439/82
5,980,270 * 11/1999 Fjelstad et al. ........................ 439/71

FOREIGN PATENT DOCUMENTS

WO 95/34106 12/1995 (WO) .

OTHER PUBLICATIONS

Firmenschrift "CIN::APSE" Groupe Labinal Division Connecteurs Cinch.

* cited by examiner

*Primary Examiner*—Gary F. Paumen
*Assistant Examiner*—Ross Gushi
(74) *Attorney, Agent, or Firm*—Schiff Hardin & Waite

(57) ABSTRACT

A contact arrangement and method of producing the contact arrangement for electrical connection between mutually opposite contact points disposed on a surface of a first and second substrate. The contact arrangement further includes an insulating body disposed between the surfaces of the first and second substrate. The insulating body has holes extending between opposite sides of the insulating body wherein a conductive layer is disposed on a surface of the holes. A contact element mat is disposed on opposite sides of the insulating body. The contact element mat includes interconnected contact elements having projections respectively engaging depressions that surround each hole.

10 Claims, 3 Drawing Sheets

CONTACT ARRANGEMENT

BACKGROUND OF THE INVENTION

1. Field of the Invention

The invention relates to a contact arrangement for electrical connection of a large number of first electrical contact points, which are arranged on an essentially planar surface of a first substrate, having a corresponding number of second electrical contact points which are arranged on an essentially planar surface of a second substrate, including a flat insulating body in which holes are formed in the grid size of the first and second contact points, through each of which holes, which is in the form of a plated-through hole, an electrical conductor passes, and contact elements which are electrically connected to the respective plated-through hole are attached to the hole ends on both sides of the insulating body.

2. Description of the Prior Art

Highly complex electrical components such as processors in some cases have hundreds of contact points which have to be electrically connected to corresponding mating contacts, for example on a printed circuit board. It is known for these contact points to be provided in the form of a so-called Land Grid Array ("LGA"). In this case, contact points are arranged in a regular grid size on an essentially planar contact surface. They are connected to the corresponding mating contact elements on a printed circuit board or on another component by means of a contact arrangement as mentioned initially, rather than by soldering. In a contact arrangement of the type mentioned initially which is marketed by the company CINCH and is known of the Company Document "CIN::APSE" of the company LABINAL COMPONENTS & SYSTEMS Inc. CINCH CONNECTOR DIVISION, U.S.A., button contacts are arranged in the holes in the insulating body, which button contacts include a tangle of thin conductive wire and project by a small amount beyond the insulating body at the hole ends. This contact arrangement is inserted between the mutually opposite contact points. The two substrates for the contact points are then mechanically pressed against one another. The elasticity of the wire tangle of the individual button contacts produces a reliable electrical connection between the mutually opposite contact points on the two substrates. A comparable contact arrangement is likewise described in U.S. Pat. No. 5,196,320.

A contact arrangement of the known type is extraordinarily complex to manufacture. The button contacts have a diameter of about 0.5 to about 1 mm. Their production and the insertion of the button contacts into the holes in the insulating body are thus tedious.

SUMMARY OF THE INVENTION

The invention is based on the object of specifying a contact arrangement of the type mentioned initially which, on the one hand, allows reliable contact between the mutually opposite contact points and, on the other hand, can be produced cheaply and easily.

This object is achieved according to the invention in that the contact elements are formed by a sheet of conductive material, and in that the hole ends are surrounded at a distance by depressions on both sides of the insulating body, in which depressions projections of the contact elements engage.

The plated-through holes can be produced electrochemically in one process step. The contact elements can likewise be attached to the two sides of the insulating body in one process step. This avoids the tedious insertion of the millimeter-size button contacts composed of a wire tangle or wire mesh into the holes in the insulating body.

The contact elements preferably include sections of a contact element mat which are separated from one another. The contact elements can thus be produced together in a simple manner, for example from a sheet of spring bronze, and can be aligned on the insulating body and attached to it, as will be explained in more detail further below.

The attachment process is carried out mechanically by the hole ends being surrounded at a distance by depressions on both sides of the insulating body, in which depressions projections of the contact elements engage.

In the region of the holes, the contact elements preferably have contact tongues, which are bent out of the plane in the region of the holes, so that the spring effect of these contact tongues ensures a reliable electrical connection between the mutually opposite contact points.

A contact arrangement of the type mentioned above can be produced in a simple manner, so that holes are first of all produced in a flat insulating body in the grid size of the contact points and each are provided with through-plating, so that a contact element mat is placed on each of the two sides of the insulating body so that the contact elements each cover one hole, and so that the contact elements are separated from one another and are connected to the insulating body in one process step. In this case, the projections on the contact elements mentioned above are pressed into the depressions which surround the holes, such that the projections mechanically grip against the walls of the depressions.

The contact element mats may be produced by stamping or etching.

DESCRIPTION OF THE PREFERRED EMBODIMENT

Figure 1:
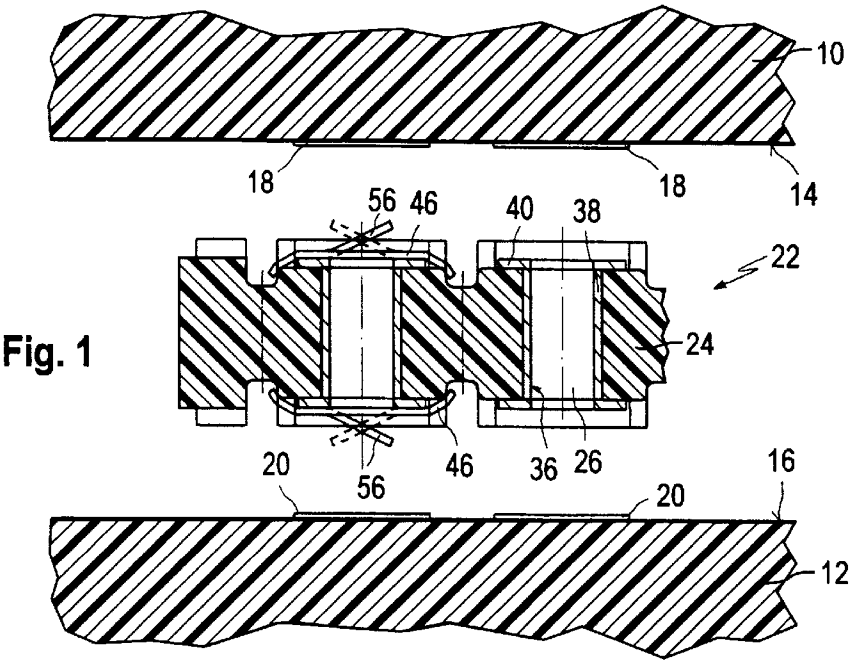
FIG. 1 shows a schematic side sectional through two substrates of contact points and a contact arrangement according to the invention arranged between them, which contact arrangement is intended to produce the electrical connection between the contact points.

In FIG. 1, two substrates are denoted by 10 and 12, and each have a large number of contact surfaces 18 and 20, respectively, on their mutually facing planar surfaces 14 and 16, respectively. The diameter and the distance between the contact surfaces 18 and 20, respectively, is approximately about 1 mm, so that the contact surfaces 18 and 20 are referred to in the following text as contact points, due to their small extent. Several hundred of these contact points 18 and 20, respectively, are arranged in a regular grid size on each of the surfaces 14 and 16. The first substrate 10 may be an electronic component, for example a processor, while the second substrate 12 may be a printed circuit board to which the component 10 is intended to be fitted.

The electrical connection between the contact points 18 on the substrate 10 and the contact points 20 on the substrate 12 is produced by a contact arrangement which is denoted in general by 22 and which will be described in more detail in the following text.

Figure 2:
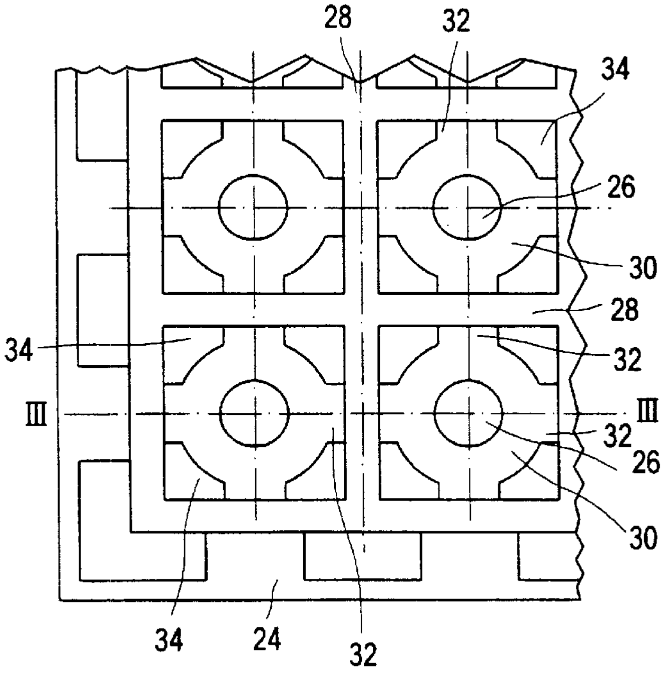
FIG. 2 shows a top view of a corner region of an insulating body of the contact arrangement.
Figure 3:
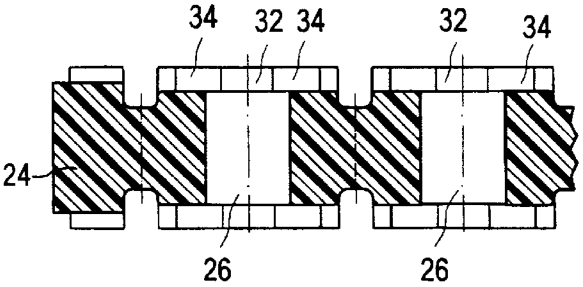
FIG. 3 shows a section through the insulating body shown in FIG. 2, along the line III—III in FIG. 2.
Figure 4:
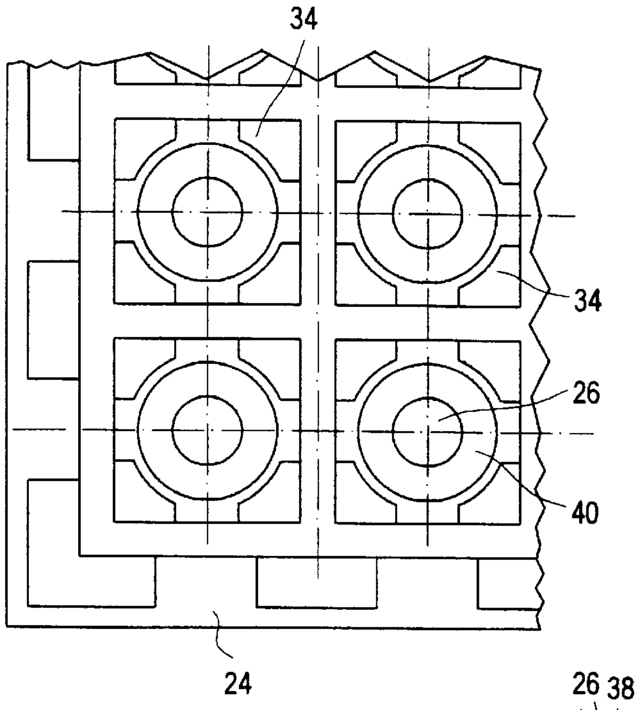
FIGS. 4 and 5 show illustrations of the insulating body corresponding to FIGS. 2 and 3, respectively, once the plated-through holes have been produced.

The contact arrangement 22 includes an insulating body 24 in the form of a thin plate (FIGS. 2 and 3) in which bores or holes 26 are formed which pass all the way through in an arrangement corresponding to the grid arrangement of the contact points 18 and 20. The holes 26 are each located in an area of a grid which is formed by grooves 28 (which cross one another at right angles) in the two surfaces of the insulating body 24. Each hole 26 is surrounded by an annular cutout 30, which projects outward in four short channels 32. In other words, there are four projections 34 in the four corners of each area, which surround the hole 26 at a distance from it and are separated from one another by the channels 32. The insulating body 24 described so far may be produced as a plastic injection-molded part.

Figure 5:
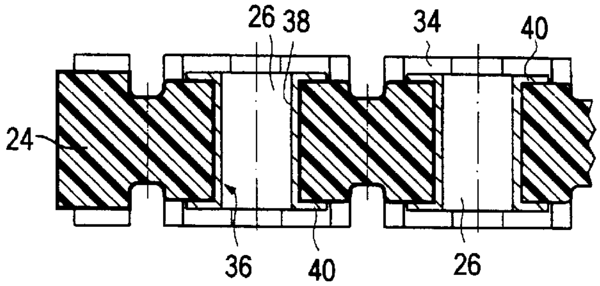
Figure 6:
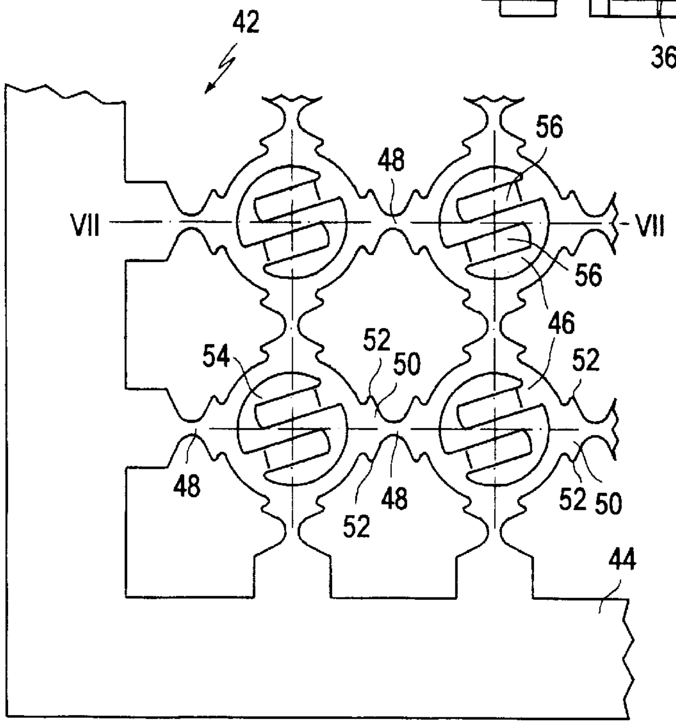
FIG. 6 shows a top view of a corner region of a contact element mat.

In a first method step, the holes 26 are provided with through-plating 36 (FIGS. 1 and 5). This forms a conductive layer 38 which covers the hole wall and continues on both sides of the insulating body 24 in a ring 40 surrounding the hole 26. A contact element mat or sheet 42, which is shown in FIG. 6, is now placed onto both sides of the insulating body 24 prepared in this way.

This contact element mat or sheet 42 is composed of a conductive material, for example of a springy bronze material, and includes a supporting frame 44 within which contact elements 46 are formed in an arrangement and quantity corresponding to the hole pattern of the insulating body 24, and these contact elements 46 are connected to one another and to the supporting frame 44 via material links 48. Such a contact element mat can be produced, for example, by stamping or etching.

Figure 7:
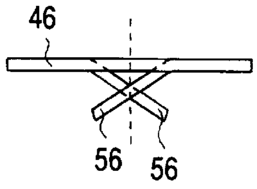
FIG. 7 shows a side sectional view through an individual contact element along the line VII—VII in FIG. 6.
Figure 8:
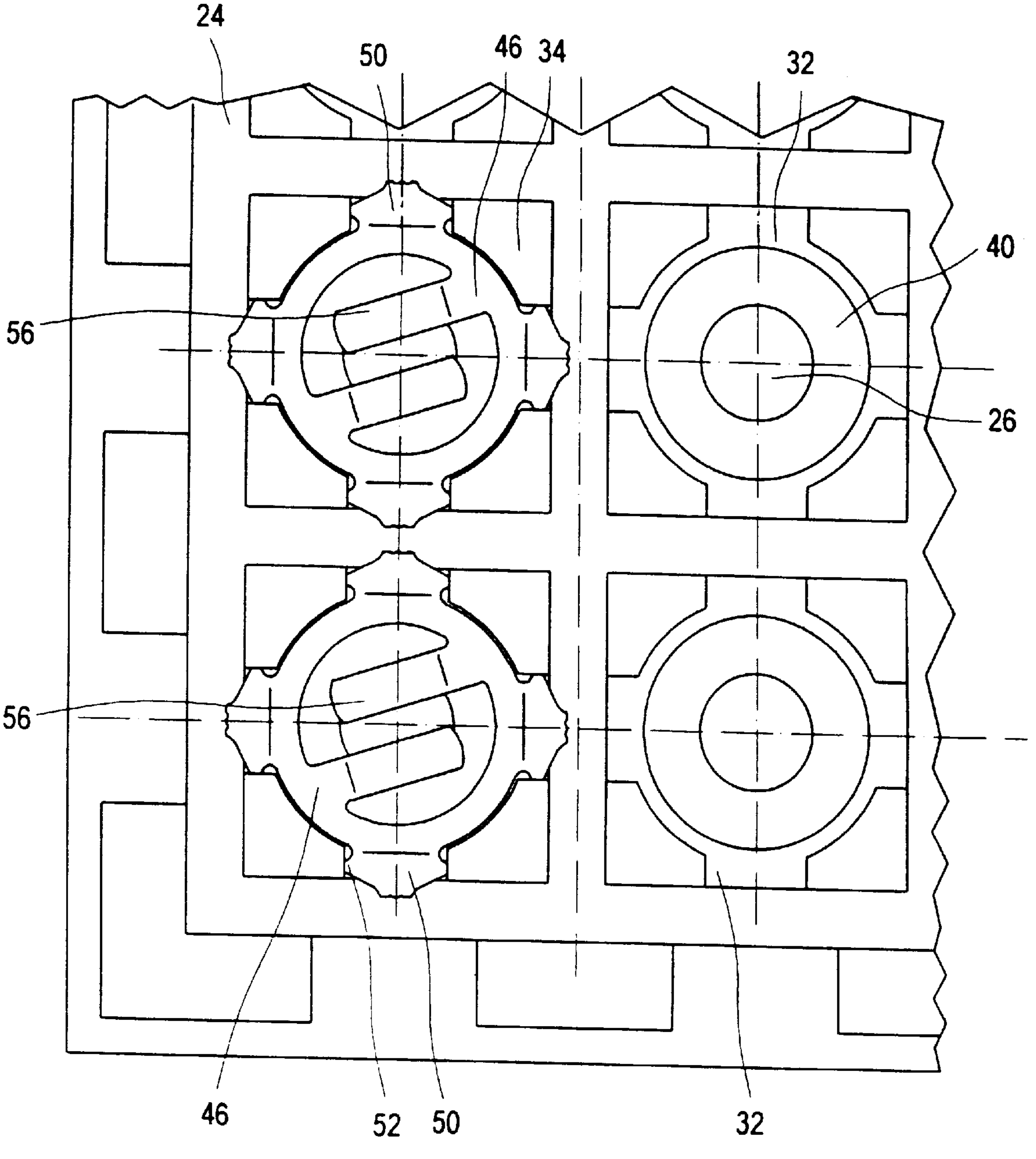
FIG. 8 shows a top view, corresponding to FIGS. 2 and 4, of an insulating body having two contact elements mounted on it.

Each material link 48 is located on a radial projection 50 which, for its part, has two pointed claws 52 pointing toward opposite sides. The center part of each individual contact element 46 has a circular cutout 54 into which two mutually parallel spring tongues 56 project in opposite directions and which, once the contact element mat 42 has been produced, project out of its plane, as is shown in FIG. 7.

Once the contact element mat 42 has been placed on the insulating body 24 that is provided with the plated-through holes 36, so that the contact elements 46 are located exactly above the grid areas of the insulating body 24 which contain the holes 26, the material links 48 are cut and the projections 50 of the individual contact elements 46 are pressed, in a single process, into the channels 32 between the projections 34, using a stamping and pressing tool (which is not illustrated), so that the projections 50 are hooked onto the pointed claws 52 on the walls which bound the channels 32. The contact elements 46 are in this way firmly attached to the insulating body 24 and rest on the rings 40 of the respective plated-through hole 36. If the substrates 10 and 12 are now pressed against one another with the contact arrangement 22 located between them, then, in conjunction with the respective plated-through hole 36, the contact elements 46 produce a conductive connection between the respective mutually opposite contact points 18 and 20. The spring tongues 56, which are bent outward, in this case ensure that reliable contact is made at the same time with all contact points.

In the contact arrangement according to the invention, the conductor length between two mutually associated contact elements is very short. The electrical connection has low induction and capacitance levels. The contact arrangement is extremely flexible in use, with different distances between the contact points which are to make contact with one another, that is to say it is virtually irrelevant for the production of the electrical connections whether the insulating body is somewhat thicker or thinner. Furthermore, the contact arrangement according to the invention can be produced several orders of magnitude more cheaply than the known solution described initially, in which a specific contact button must be inserted into each hole and it is necessary to ensure that this contact button projects out of the hole by a certain amount on both sides.

Although modifications and changes may be suggested by those skilled in the art, it is the intention of the inventors to embody within the patent warranted hereon all changes and modifications as reasonably and properly come within the scope of their contribution to the art.

What is claimed is:

1. A contact arrangement for an electrical connection between mutually opposite contact points, comprising:

a first substrate having a first surface and a plurality of first electrical contact points disposed on said first surface;

a second substrate having a second surface parallel to the first surface and a plurality of second electrical contact points disposed on said second surface;

an insulating body having a plurality of holes extending between opposite sides of said insulating body and a plurality of depressions surrounding said holes on said opposite sides of said insulating body, each hole having a hole surface and a conductive layer disposed on each hole surface, a conductive ring in said depressions connecting to said conductive layer, and said insulating body being disposed between said first and second substrate; and a plurality of contact elements on top of said rings and electrically connected to said rings, said contact elements comprising a conductive material and having a plurality of projections, said projections respectively engaging said depressions in said insulating body.

2. The contact arrangement according to claim 1 wherein said contact elements comprise a springy bronze material.

3. The contact arrangement according to claim 1 wherein each contact elements comprise a contact tongue, said contact tongue outwardly extending to said contact points of said first and second substrates.

4. The contact arrangement according to claim 1 wherein said depressions comprise an annular cutout with short channels extending outwardly from the annular cutout, and wherein said contact elements comprise radial projections with the radial projections having pointed claws for engaging with walls of the short channels to lock the contact element in the depressions on top of said respective rings.

5. A method for producing a contact arrangement for electrical connection between mutually opposite contact points, comprising the steps of:

providing first and second substrates, each substrate having a surface with a plurality of contact points disposed on said surface, said contact points of said first substrate being positioned mutually opposite said contact points of said second substrate;

providing an insulating body, said insulating body including a plurality of holes extending between opposite sides of said insulating body and a plurality of depressions surrounding each hole on said opposite sides of said insulating body;

providing a plurality of contact element mats each having a plurality of contact elements connected to each other by material links, said contact elements each having a plurality of projections;

providing a conductive layer in the holes at said insulating body and a conductive ring at ends of the holes connecting to the conductive layer in the depressions;

aligning the respective contact element mats over opposite sides of said insulating body so that the contact elements of the mats overlie the depressions;

in a single process, cutting the material links between the contact elements and pressing the contact elements into the depressions so that the projections of the contact elements lock the respective contact elements in the depressions;

inserting said insulating body between said surfaces of said first and second substrate; and producing said electrical connection by pressing together said first and second substrates.

6. The method according to claim 5 including the step of providing the contact element projections as pointed claws which engage on walls of the respective depressions.

7. The method according to claim 5 including the step of providing the depressions as an annular cutout with radially extending short channels, and engaging the projections of the contact elements on walls of the short channels.

8. The method according to claim 5 including the step of using a stamping and pressing tool to release the contact elements from the mat by cutting the material links, and then pressing the contact elements into the depressions.

9. The method according to claim 5 including the step of providing the contact elements of a springy bronze material.

10. The method according to claim 5 including the step of providing at least one projecting tongue on each contact element.

* * * * *